(12) United States Patent
Miller et al.

(10) Patent No.: US 6,911,814 B2
(45) Date of Patent: Jun. 28, 2005

(54) APPARATUS AND METHOD FOR ELECTROMECHANICAL TESTING AND VALIDATION OF PROBE CARDS

(75) Inventors: Charles A. Miller, Fremont, CA (US); Emad B. Hreish, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/612,235

(22) Filed: Jul. 1, 2003

(65) Prior Publication Data
US 2005/0017708 A1 Jan. 27, 2005

(51) Int. Cl.$^7$ ............................................. G01R 31/02
(52) U.S. Cl. ............................... 324/158.1; 324/754
(58) Field of Search ..................... 324/73.1, 754–762, 324/158.1; 702/85, 89, 104, 119

(56) References Cited

U.S. PATENT DOCUMENTS

| | | | | |
|---|---|---|---|---|
| 4,918,374 A | * | 4/1990 | Stewart et al. | 324/758 |
| 5,561,377 A | * | 10/1996 | Strid et al. | 324/754 |
| 6,414,477 B1 | * | 7/2002 | Strom | 324/158.1 |
| 6,606,575 B2 | * | 8/2003 | Miller | 702/104 |
| 6,622,103 B1 | * | 9/2003 | Miller | 702/89 |

* cited by examiner

*Primary Examiner*—Minh N. Tang
(74) *Attorney, Agent, or Firm*—N. Kenneth Burraston

(57) ABSTRACT

A method of testing a probe card includes the step of positioning the probe card in a prober over a verification wafer that is placed on a stage. The probe card is brought in contact with a contact region on the verification wafer. The verification wafer includes a shorting plane surrounding the contact region. A test signal is sent through the verification wafer to the probe card. A response signal from the probe card is received and analyzed.

28 Claims, 14 Drawing Sheets

APPARATUS AND METHOD FOR ELECTROMECHANICAL TESTING AND VALIDATION OF PROBE CARDS

BACKGROUND OF THE INVENTION

1. Field of the Invention

The present invention relates to testing of equipment used in semiconductor manufacturing, and more particularly, to testing of probe cards that are used to probe semiconductor wafers.

2. Related Art

Semiconductor dies must be tested during the manufacturing process to insure the reliability and performance characteristics of the integrated circuits on the dies. Accordingly, different testing procedures have been developed by semiconductor manufacturers for testing semiconductor dies. Standard tests for gross functionality are typically performed by probe testing the dies at the wafer level. Probe testing at the wafer level can also be used to rate the speed grades of the dies.

Testing a large number of integrated circuit chips in parallel at the wafer level provides a significant advantage since test time and cost are substantially reduced. At present, large scale testers including mainframe computers are needed to test even one chip at a time, and the complexity of these machines is increased when the capability of testing arrays of chips in parallel is added. Nevertheless, because of the time savings parallel testing provides, high pin-count testers capable of probing and collecting data from many chips simultaneously have been introduced, and the number of chips that can be tested simultaneously has been gradually increasing.

An important element of the testing apparatus is a probe card, which includes a number of probes that in turn connect to the wafer under test during the testing process. Ensuring that the probe card is itself functioning properly is therefore an important part of the testing process.

SUMMARY OF THE INVENTION

The present invention is directed to a method of testing a wafer test probe card that substantially obviates one or more of the problems and disadvantages of the related art.

There is provided a method of testing a probe card that includes the step of positioning the probe card in a prober over a verification wafer that is positioned on a stage. The probe card is brought in contact with a contact region on the verification wafer. The verification wafer includes a shorting plane surrounding the contact region. A test signal is sent through the verification wafer card to the probe card. A response signal from the probe card is received and analyzed.

In another aspect there is provided a method of testing a probe card including the steps of positioning the probe card in a prober over a blank wafer that is positioned on a stage. The probe card is brought in contact with the blank wafer. The probes of the probe card make scrub marks on the blank wafer by moving the blank wafer in an X, Y plane using the stage. The scrub marks on the blank wafer are examined to determine location of the probes on the probe card.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

The invention is applicable to probing a semiconductor wafer to test semiconductor dies on a wafer.

Figure 1:
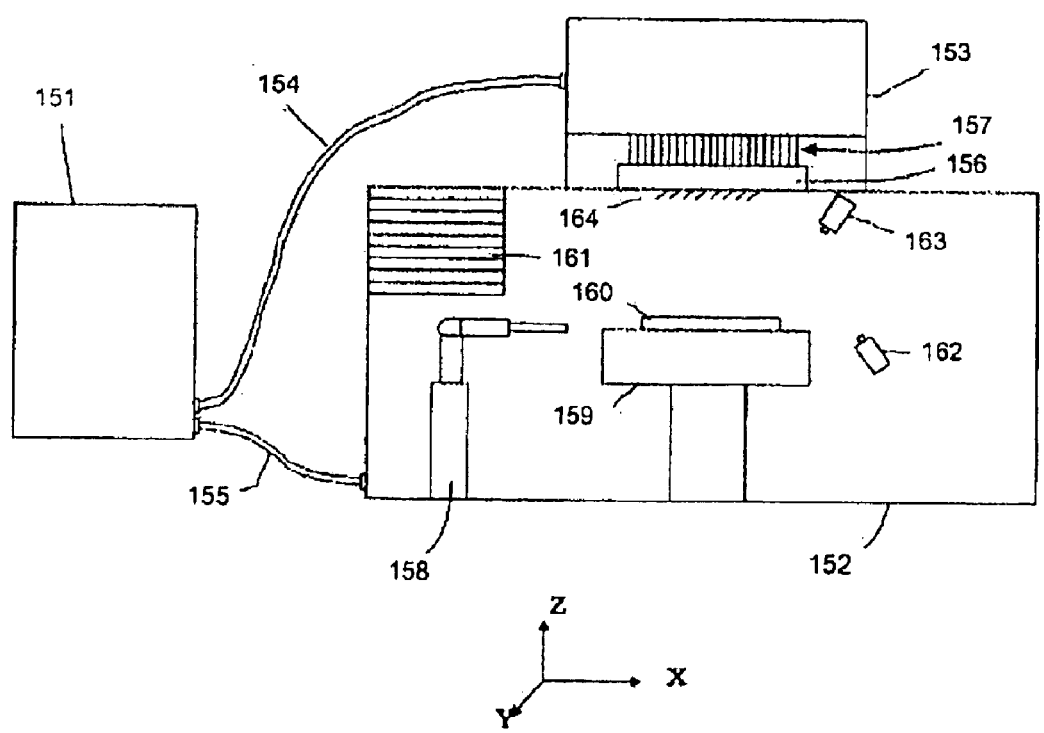
FIG. 1 illustrates a front view of a semiconductor probing system.
Figure 2:
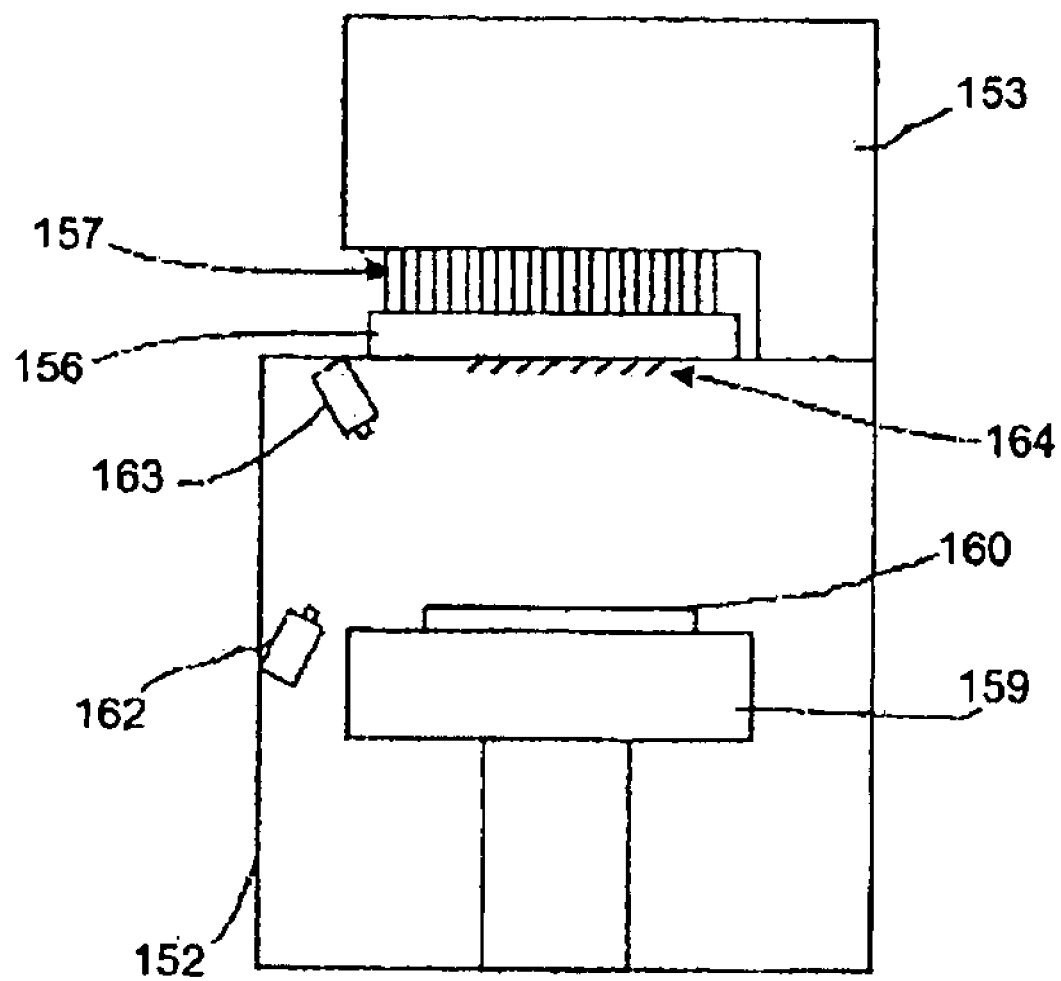
FIG. 2 illustrates a side view of the semiconductor probing system of FIG. 1.

FIGS. 1 and 2 illustrate a semiconductor probing system. As shown in FIG. 1 showing a front view, and in FIG. 2 showing a side view, the semiconductor probing system includes a tester 151 connected to a prober 152 by two communications cables 154 and 155. A wafer boat 161 is mounted within prober 152, and holds a plurality of wafers 160. One wafer 160 (commonly called "wafer under test," or WUT) is placed on a stage 159 by a robotic arm 158. Prober 152 is connected to tester 151 by the communications cable 155. A test head 153 is connected to tester 151 by the communications cable 154. Test head 153 includes a probe card 156 with a plurality of electrical connections 157 to a plurality of probes 164. An upward looking camera 162 and a downward looking camera 163 are used for alignment of the WUT 160 on the stage 159, and the alignment of the probes 164 with test pads on the WUT 160 when the WUT 160 is being positioned with respect to probe card 156.

Typically, stage 159 moves WUT 160 vertically (that is, in the z direction) in bringing the test pads on WUT 160 into contact with the probes 164. Tester 151 controls the testing processes. It generates test data, which is sent to test head 153 via communication cable 154, and to prober 152 via cable 155. Tester 151 is typically a computer.

Test head 153 receives test data from tester 151, and passes the test data through probe card 156 to wafer 160. Test head 153 receives response data generated by wafer 160 through probe card 156, and sends the response data to tester 151.

Stage 159 supports wafer 160 being tested, and moves vertically and horizontally. Stage 159 is also capable of being tilted and rotated. It moves wafer 160 being tested against probes 164. One or more cameras 162, 163 in prober 152 identify alignment marks on wafer 160 and probe card 156 to aid in properly positioning wafer 160 against probe card 156.

Robotic arm 158 moves wafers 160 between stage 159 and wafer boat 161.

Figure 3:
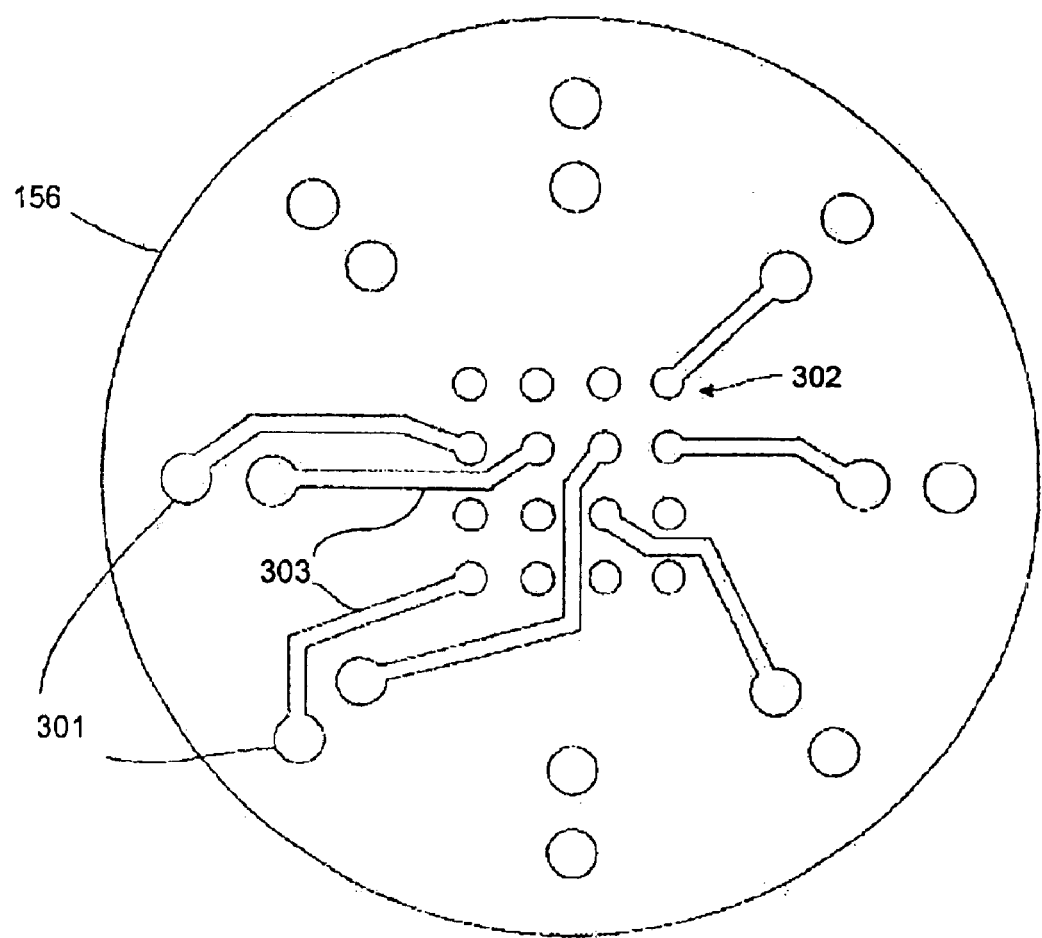
FIG. 3 illustrates a top view of a probe card of one embodiment of the present invention.
Figure 4:
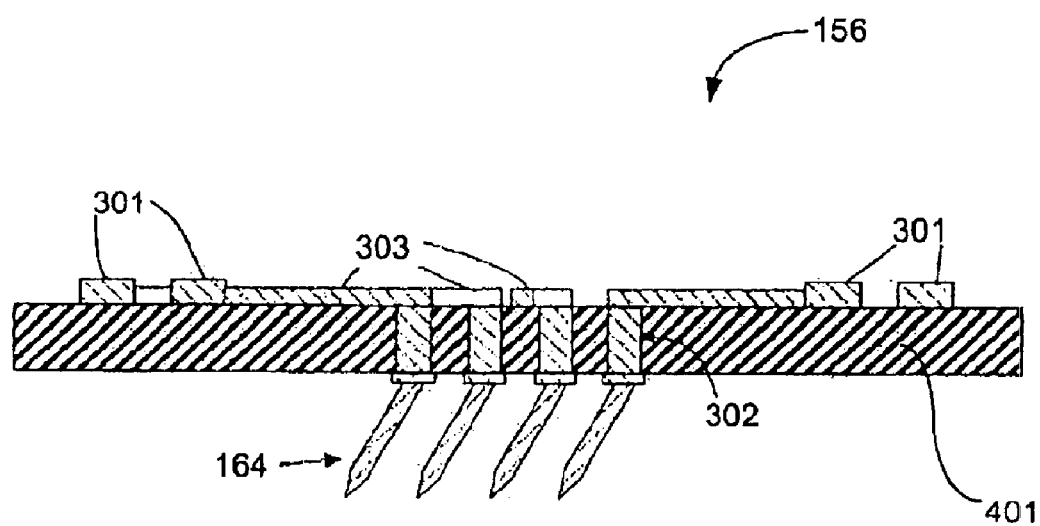
FIG. 4 illustrates a side view of a probe card of one embodiment of the present invention.
Figure 5:
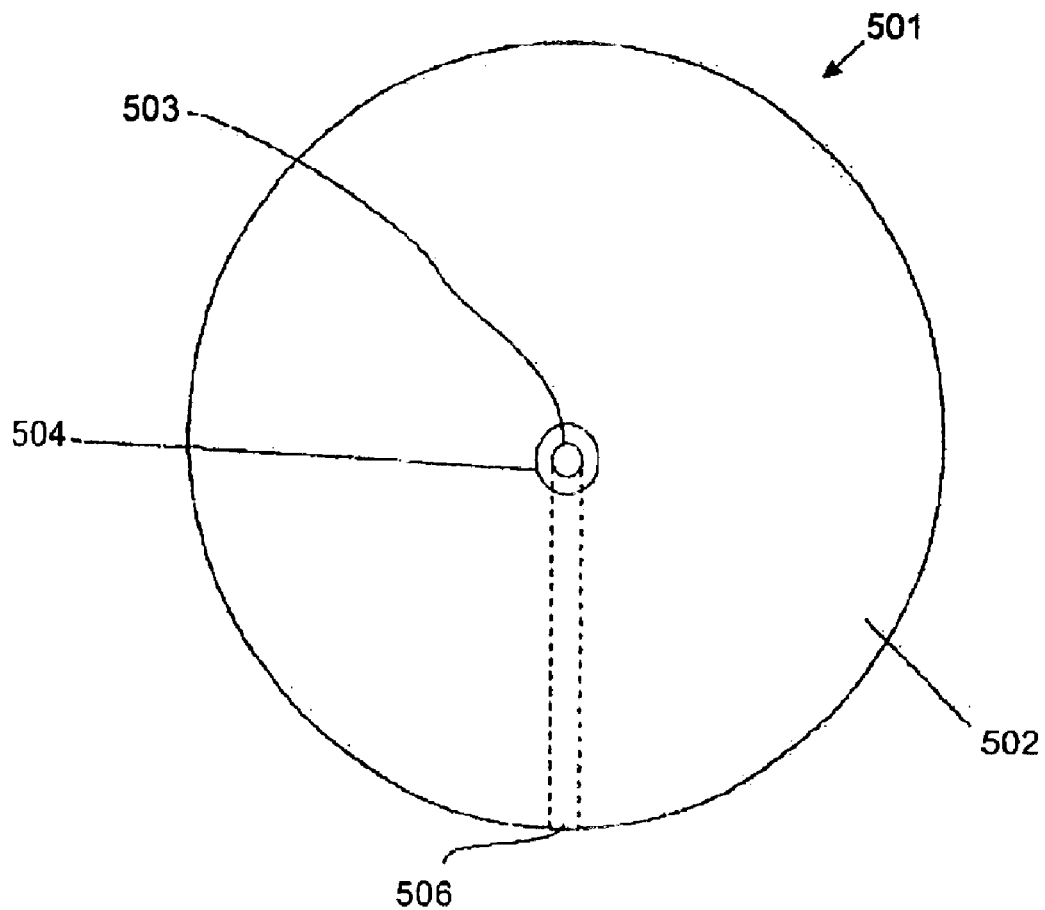
FIG. 5 illustrates a top view of a verification wafer of one embodiment of the present invention.

FIGS. 3 and 4 show top and side views, respectively, of a simplified probe card 162. Typically, the electrical connections between test head 153 and probe card 156 shown in FIGS. 1 and 2 are formed by pogo pins 157 that contact pogo pin pads 301 on probe card 156. In FIG. 4, sixteen pogo pin pads 301 are shown in pairs of two located along the periphery of probe card 156. As also shown in FIG. 3, sixteen vias 302 are disposed in the center of probe card 156 in a two-dimensional square array and are connected to pads 301 with traces 303. Only seven traces 303 are shown for clarity. In this example, sixteen pogo pins 301 are electrically connected through sixteen traces 303 to the sixteen via 302. The vias 302 provide electrical paths through probe card 156 to probes 164. As shown in FIGS. 3 and 4, traces 303 connect pogo pin pads 301 to vias 302. Probe card 156 is actually shown in FIGS. 3 and 4 in a simplified form. For example, a typical probe card usually has hundreds of pogo pin pads 301, vias 302, and probes 164. In addition, probe card 156 typically includes more than one substrate 401 shown in FIG. 4. For example, a probe card assembly with three substrates (a PCB, interposer, and a space transformer) is shown in FIG. 5 of U.S. Pat. No. 5,974,662, which is incorporated by reference herein, and is a general example of the basic structure of a probe card assembly.

Prober 152 may be used to test a newly manufactured probe card 156. Prober 152 may also be used to periodically test a probe card 156 while probe card 156 is being used to test semiconductor wafers.

Figure 6:
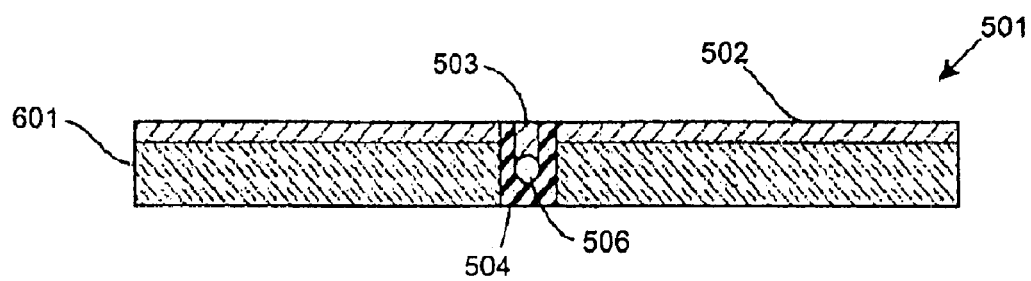
FIG. 6 illustrates a side view of the verification wafer of one embodiment of the present invention.

Probe card 156 that needs to be tested is placed in prober 152. The electrical connections shown in FIGS. 1 and 2 connecting probe card 156 to test head 153, however, are not made. (Prober 152 need not be connected to tester 153.) A verification wafer 501, such as the one illustrated in FIGS. 5 and 6, is placed on stage 159. As shown in FIGS. 5 and 6, verification wafer 501 has a shorting plane 502 with a contact 503 in the middle of a substrate 601. Contact 503 is insulated from shorting plane 502 by an insulator 504.

Figure 7:
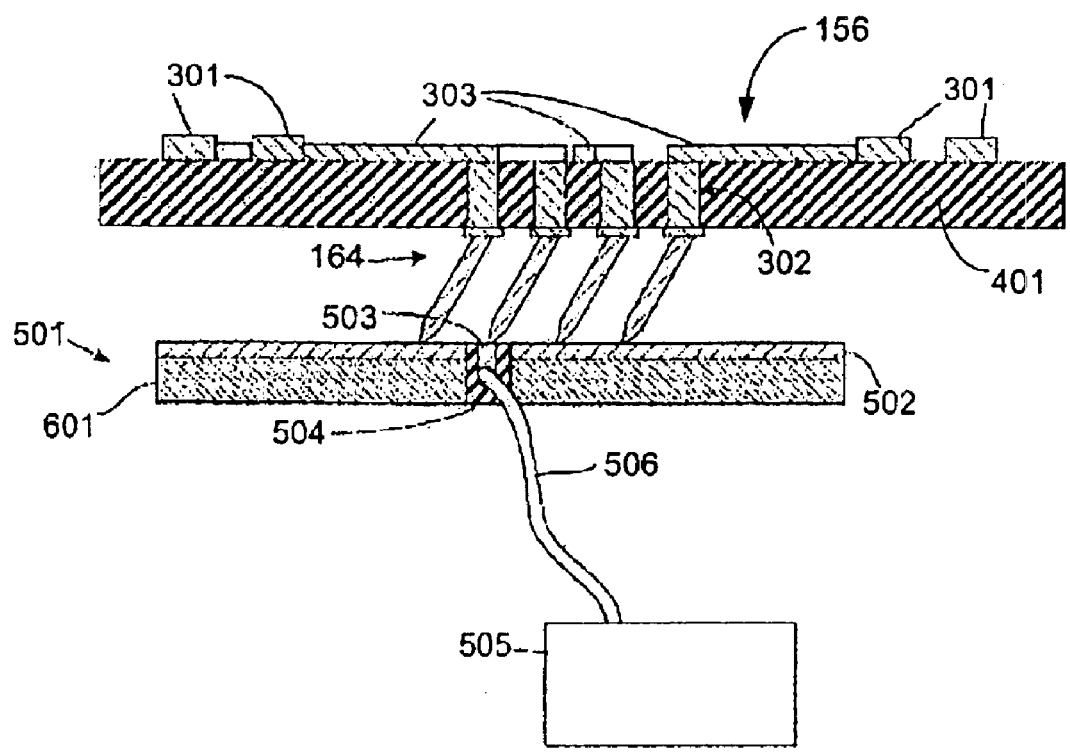
FIG. 7 illustrates a connection between the verification wafer and a tester.

As shown in FIG. 7, contact 503 is connected to one or more test drivers 505 by a cable 506, which may be, for example, a flex cable, or a coaxial cable. Although not shown, shorting plane 502 is grounded. As shown, verification wafer 501 is then moved into contact with probes 164. One of probes 164 touches the "contact" 503 of verification wafer 501, and other probes 164 contact shorting plane 502.

Substrate 601 in FIGS. 5 and 6 may be any substrate (e.g., printed circuit board material, ceramic material, etc.) The electrical interconnection 506 to test driver 505 may be any form of electrical connection (e.g., a coaxial cable, a flex strip, etc.)

Substrate 601 in FIGS. 5 and 6 may also be a semiconductor wafer. In that case, it may be difficult to create a "passage" that extends out of the side of substrate 601. A passage that extends out of the bottom of the substrate 601 would be easier to make. If such a verification wafer 501 is used, stage 159 may be modified to include an opening in its surface to receive a connection means (e.g., a coaxial cable) and a passage through which the connection means exits stage 159 to connect to test driver 505 (as shown in FIG. 7).

A number of tests can be performed on probe card 156.

A continuity test determines whether there is a short or open in the path between a pogo pin 157 and probe 164. Continuity test can be performed on probe card 156 of FIG. 7 by using a time domain reflectometry ("TDR") driver as a test driver. A TDR driver generates a pulse. Because pogo pins 157 are not connected to test head 153, the pulse should travel from probe 164 being tested (i.e., probe 164 touching "contact" 503 on verification wafer 501) through probe card 156 to pogo pin 157 and reflect back through probe card 156 to the TDR driver. If such a reflection is not detected, or the reflection has a voltage level less than an expected level, there is a short in probe card 156 between probe 164 and pogo pin 157. If the reflection is detected sooner than the time required for the pulse to travel to and return from pogo pin 157, there is an open in probe card 156 between probe 164 and pogo pin 157.

Figure 8:
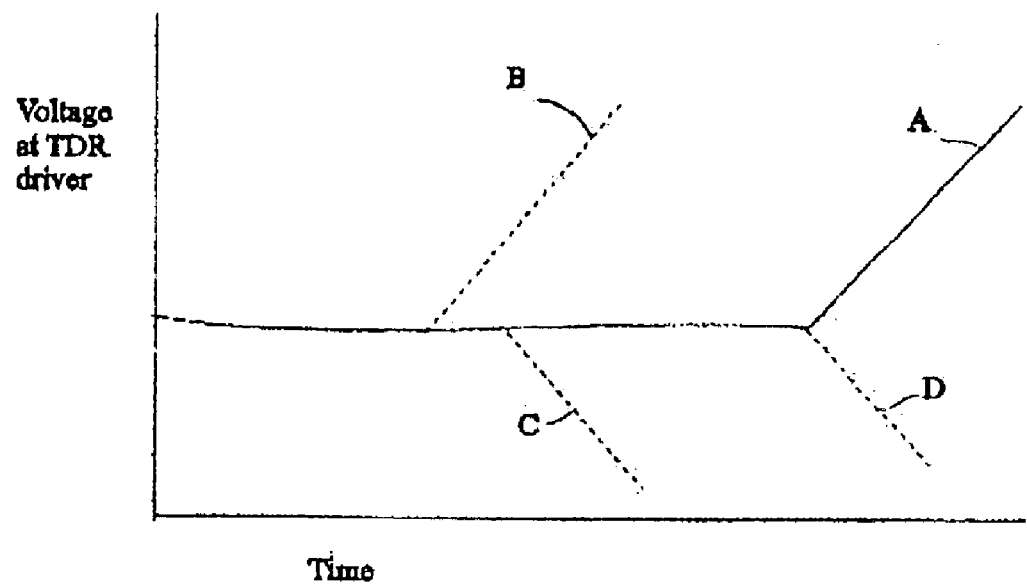
FIG. 8 shows an exemplary time domain reflectometry plot.

FIG. 8 illustrates an example of the voltage at the TDR driver during such a test. As shown, the voltage initially corresponds to the pulse driven on the line. If the voltage spikes up after a time delay sufficient for the pulse to have traveled to and from pogo pin pad 301 (as in "A"), the path between probe 164 and pogo pin pad 301 is free of shorts and opens. If the voltage spikes too soon (as in "B"), there is an open in the path. If the voltage drops off suddenly (as in "C" or "D"), there is a short in the path.

The impedance of the path between probe 164 and pogo pin 157 can be estimated using the TDR driver. The impedance of the path can be estimated from the voltage levels of the initial pulse and the reflected pulse.

A better determination of impedance can be obtained using a frequency domain reflectometry ("FDR") test driver. In an FDR test, the line is driven at a periodic voltage wave form having a particular frequency. A directional coupler on the line allows the initial waveform to pass down the line, but diverts the reflected waveform to a sensor. The impedance of the line can be determined from the phase shift of the reflected waveform as compared to the initial waveform.

In one example, the rise time of the reflected pulse (using TDR) is related to the bandwidth of the line (e.g., the slope of "A" in FIG. 8).

A current leakage test can be performed by causing the test driver to place a voltage on the probe touching "contact"

503 of verification wafer 501. The current drawn from the test driver is the leakage current of probe 164.

Note that leakage between power and ground probes (that is, probes 164 that will provide power and ground connections to WUT 160) cannot be performed using verification wafer 501 shown in FIG. 7, but must be performed off line (e.g., manually). This is because probes 164 are not connected to power or ground during these tests. In addition, there are usually multiple ground probes and multiple power probes, and all ground probes are interconnected, as are all power probes. Thus, if one power probe is connected to "contact" 503 on verification wafer 501, the other power probes will be in contact with shorting plane 502, and significant leakage will always be detected.

A planarity verification test may also be performed each time contact 503 on verification wafer 501 is brought into contact with probe 164, by recording the position of stage 159 at the point in time when contact is made. Contact with probe 164 may be detected with a TR driver set to apply periodically a pulse to the line. As soon as contact with probe 164 is made, the length of time to detection of the reflected pulse will increase (e.g., the reflected pulse will move from position "B" to position "A" in FIG. 8). Alternatively, contact with probe 164 may be detected in other ways, such as using cameras 162, 163 in prober 152. The position of stage 159 at first contact with each probe 164 is recorded (manually or by software controlling the tests and operating in prober 152). In this way, the height of the tip (i.e., the "z" position) of each probe 164 may be determined.

A probe location verification test may also be performed. Cameras 162, 163 in prober 152 may be used to determine the position of each probe 164 (i.e., the "x, y" position) and verify that each position is within specification.

Alternatively, a blank wafer may be placed on stage 159 in place of verification wafer 501. The blank wafer on stage 159 may then be brought into contact with probes 164. The blank wafer may then be removed and the scrub marks made by probes 164 examined to determine that (1) their "x, y" positions (the point at which they make initial contact with the blank wafer) are in an appropriate range, and (2) they make sufficiently long scrub marks.

Prober 152 may include a temperature controller for controlling the temperature in prober 152. If a temperature controller is used, the tests described above may be performed at various temperatures within the expected operating temperature range of probe card 156. In addition, probe card 156 may be "burned in." That is, in the presence of an elevated temperature, probe card 156 may be repeatedly brought into and out of contact with verification wafer 501, which will tend to accelerate failure of probes 164 due to latent mechanical defects.

It will be apparent that multiple test drivers may be used. Various means may be used to select one test driver for use, such as switches, etc. Alternatively, multiple "contacts" 503 may be formed on verification wafer 501, each connected to one test driver 505.

As mentioned above, in addition to testing newly manufactured probe cards 156, the invention may be used to verify continued good operation of a probe card 156 during use of probe card 156 to test semiconductor wafers. For example, after every 100 semiconductor wafers are tested, verification wafer 501 may be used to verify the continued integrity of probe card 156. As another example, if dice in the same locations on semiconductor wafers are failing (which may indicate a problem with probe card 156 rather than wafers 160), verification wafer 501 may be used to retest probe card 156.

Figure 9:
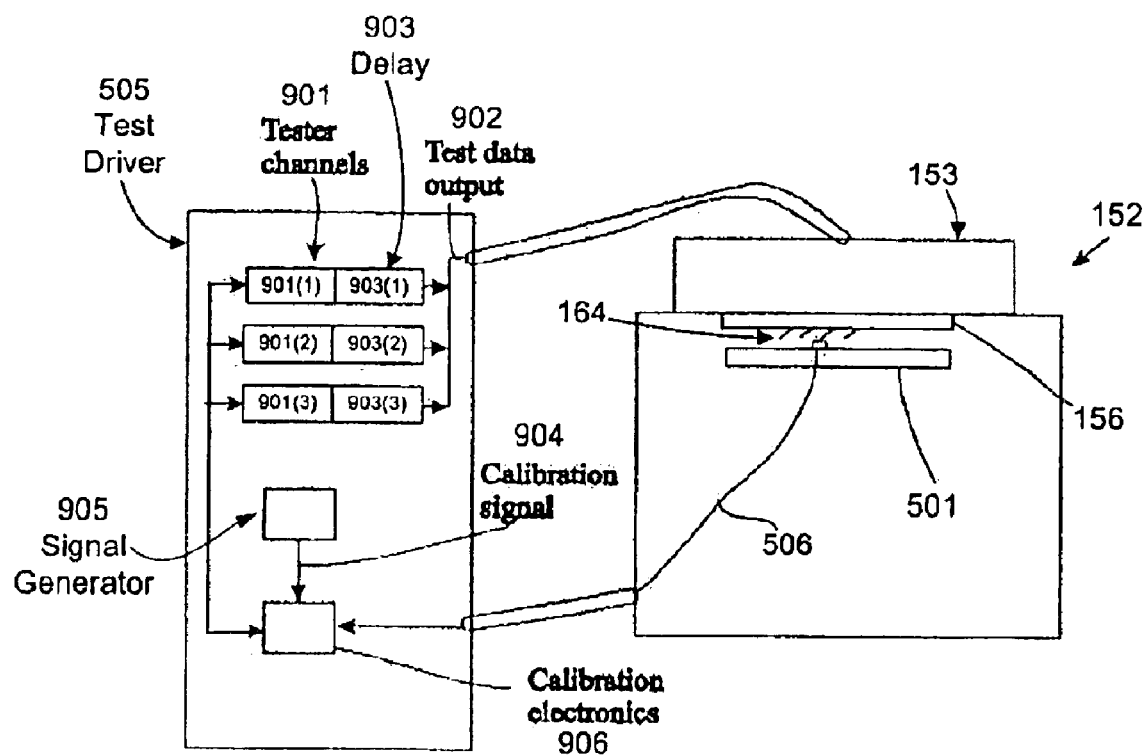
FIG. 9 shows connections between a prober and a tester of one embodiment of the present invention.

The present invention may also be used to calibrate probe card 156. FIG. 9 shows an example of probe card 156 calibration. Three channels 901(1), 901(2) and 901(3) of a test driver 505 are shown. A tester channel 901 sends and/or receives test data 902 to prober 152. Usually, there is one channel 901 for each probe 164 on probe card 156. In FIG. 9, test data signal 902 having a particular pattern is generated on a tester channel 901 and fed back to the calibration electronics 906. Calibration electronics 906 compares the fed-back signal to a calibration signal 904, which has the same pattern as test data 902. Calibration electronics 906 adjusts a settable delays 903(1)–903(N) in tester channels 901(1)–901(N) until the fed-back signal matches calibration signal 904 generated by signal generator 905. This process is then repeated for each tester channel 901, after which the adjustable delay should be set in each tester channel 901 such that test data 902 generated in one tester channel 901 arrives at the probes 164 at the same time as test data 902 generated in another tester channel 901. This calibration method is also discussed in co-pending commonly assigned U.S. patent application Ser. No. 09/752,839, filed on Dec. 29, 2000, which is incorporated herein by reference.

As discussed below, and illustrated in FIGS. 10–19, it may be necessary to accurately adjust the drive and compare calibration delays of channels 901 of tester 151 at the tips of probes 164 so as to account for time delays through interconnect system (unlabeled in FIG. 10.) The drive calibration delays are adjusted first, and then the compare calibration delays are adjusted.

Figure 10:
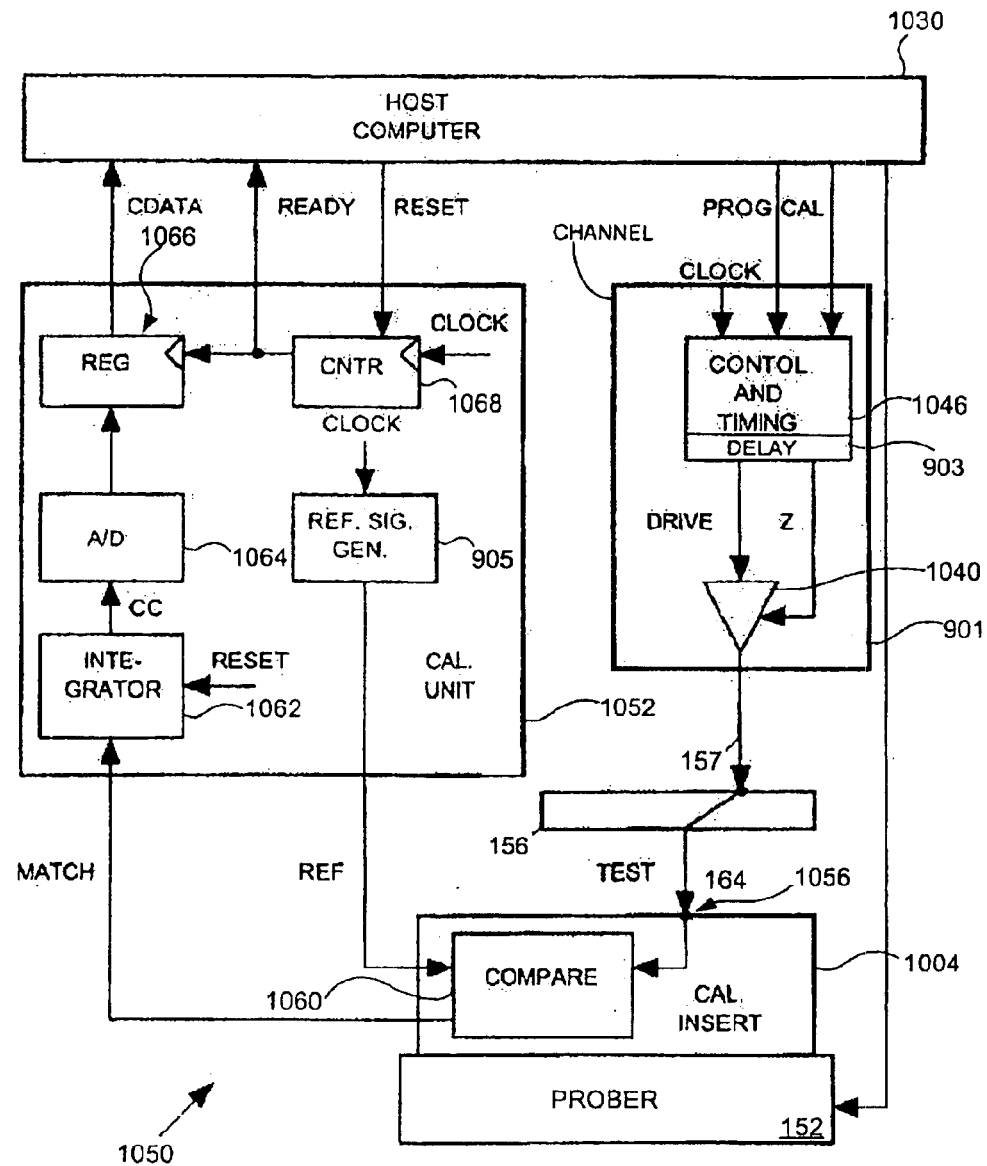
FIG. 10 is a block diagram of an apparatus for calibrating the timing of the tester of FIG. 1.

FIG. 10 illustrates in block diagram form an apparatus 1050 for adjusting the drive calibration delay of each channel 901. Drive calibration apparatus 1050 includes a calibration unit 1052 residing within or external to test head 153 of tester 151 and a calibration insert 1004 residing on prober 152 during the calibration process in place of wafer 160 to be tested later. To determine how to adjust the drive calibration data for a particular tester channel 901, host computer 1030 signals prober 152 to position calibration insert 1004 so that a contact 1056 on the upper surface of calibration insert 1004 contacts the particular probe 164 on the underside of probe card 156 that normally delivers the channel's output TEST signal to a bond pad on the surface of wafer under test 160 or, alternatively, to verification wafer 501.

Figure 11:
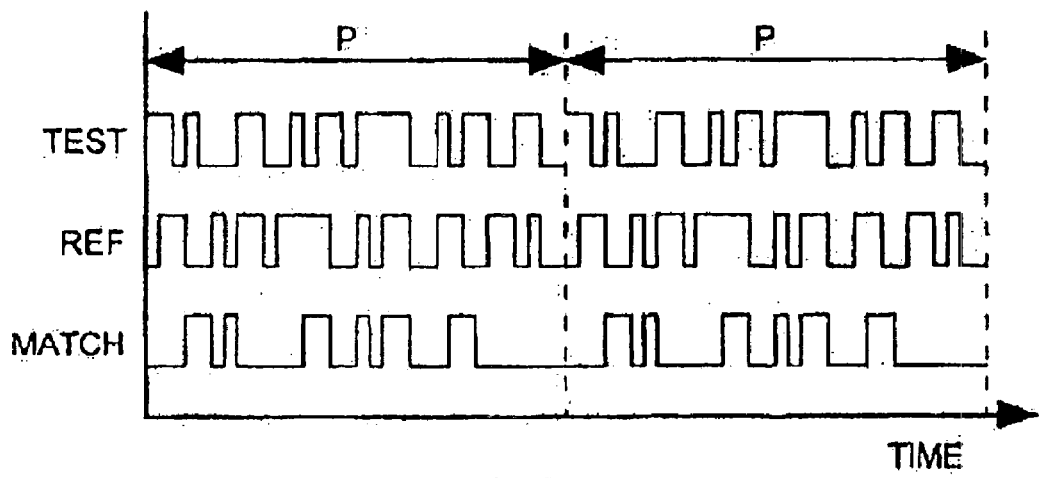
FIGS. 11–13 are timing diagrams illustrating timing relationships between various signals of FIG. 10.

Host computer 1030 also programs the channel's control and timing unit 1046 so that it produces a repetitive TEST signal pattern in response to the system CLOCK signal. The TEST signal may have uniform periods between successive pulses, but it is preferable that with each repetition of the TEST signal pattern, time intervals between successive TEST signal pulse edges be non-uniform or pseudo-random. FIG. 11 illustrates a suitable pseudo-random TEST signal pattern that is repetitive with a period P ns (nanoseconds) but wherein pulses within each cycle are of non-uniform, pseudo-random width and separation.

Host computer 1030 also programs reference signal generator 905 (suitably a spare tester channel) to produce a reference signal REF having a pattern similar to that of the TEST signal. As illustrated in FIG. 11, the calibration insert includes a compare circuit 1060 for comparing the TEST and REF signals and producing an output MATCH signal. The MATCH output of compare circuit 1060 indicates how well the amplitude of the TEST signal matches that of the REF signal. When both signals are high or both signals are low, the MATCH signal is high. When the TEST signal and the REF signals are of opposite states, the MATCH signal is low. Compare circuit 1060 may be implemented by an XOR gate, but it is preferable to implement compare circuit 1060 as an analog circuit, for example via an analog multiplier, so that the MATCH signal amplitude can fall anywhere within a continuous range of values depending on how well the TEST signal amplitude matches the REF signal amplitude.

While channel 901 and reference signal generator 905 are programmed to produce TEST and REF signals having similar pattern in response to the same CLOCK signal, the TEST and REF signals won't necessarily arrive at compare circuit 1060 in phase with one another. The phase difference between the two signals arises from differences in signal path lengths and in the inherent delays with which channel 901 and reference signal generator 905 respond to the CLOCK signal. The programmable drive calibration delay 903 of control and timing circuit 1046 also influences the phase difference between the TEST and REF signals. Calibration unit 1052 processes the MATCH signal to provide cross-correlation data (CDATA) that is a measure of the phase difference between the TEST and REF signals. Host computer 1030 calibrates the drive delay 903 of tester channel 901 by iteratively adjusting the calibration data input to control and timing circuit 1046 until the CDATA indicates that the TEST signal is in phase with the REF signal.

Figure 12:
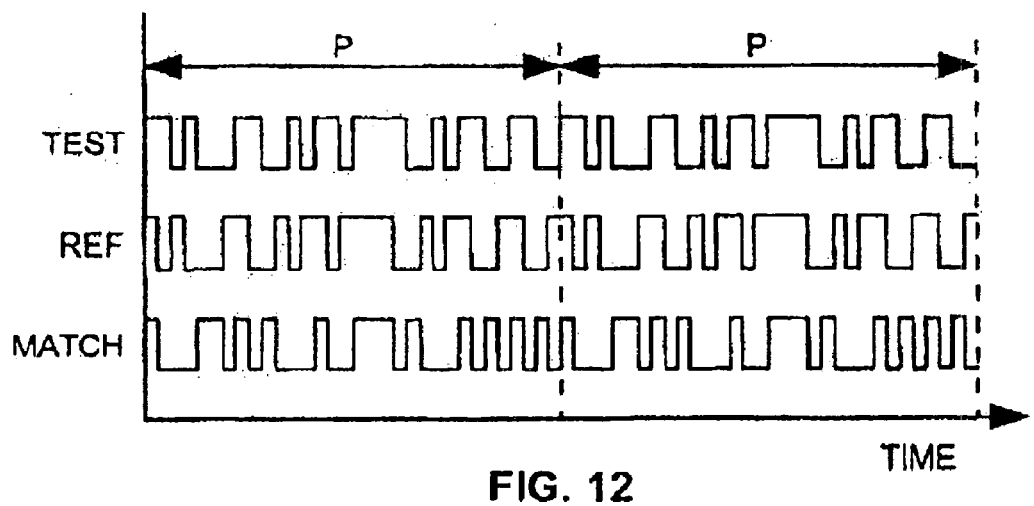
Figure 13:
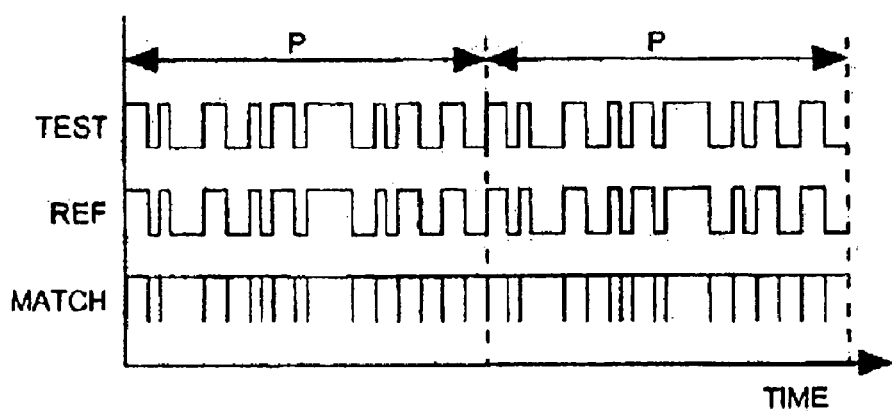

FIGS. 11–13 are simplified timing diagrams illustrating the nature of the MATCH signal for three different phase relationships between the TEST and REF signals. In practice the TEST, REF and MATCH signals can be noisy and jittery and will have less abrupt edges that depicted in FIGS. 11–13. FIGS. 11, 12 and 13 illustrate the MATCH signal produced when the TEST signal lags the REF signal by 3P/16, P/64 and nearly 0 ns, respectively. Note that as the TEST signal is brought closer into phase with the REF signal, the MATCH signal is more frequently high than low. When the TEST signal is substantially in phase with the REF signal as illustrated in FIG. 13, the MATCH signal will be high most of the time and will be low only briefly during signal transitions. Even when the TEST signal is as close as possible in phase to the REF signal, jitter and noise in the TEST and REF signals will cause them to transition at slightly different times or rates. Thus the MATCH signal will have some negative-going spikes during TEST and REF signal transitions.

Referring again to FIG. 10, calibration unit 1052 includes an integrator circuit 1062 which integrates the MATCH signal to produce an input to an A/D converter 1064. A/D converter 1064 converts the analog output of integrator 1062 into digital data input to a register 1066 clocked by a counter 1068. After programming control and timing circuit 1046 and reference signal generator 905 to produce TEST and REF signal having the same pattern, host computer resets counter 1068 and integrator 1062. Integrator 1062 then begins integrating the MATCH signal and its analog output "cross-correlation" signal CC begins to increase in value at an average rate that is proportional to the amount of time during each period P of the TEST signal that the MATCH signal is high. Thus the closer that the TEST signal is in phase to the REF signal, the more rapidly analog CC signal magnitude increases.

When counter 1068 has counted a number of CLOCK signal cycles spanning a large number of TEST signal periods, it transmits a READY signal to register 1066 telling it to load the digital output of AID converter 1064, a value proportional to the current magnitude of cross-correlation signal CC. Host computer 1030 also responds to the READY signal by reading the value of the cross-correlation data (CDATA) last stored in register 1066.

Figure 14:
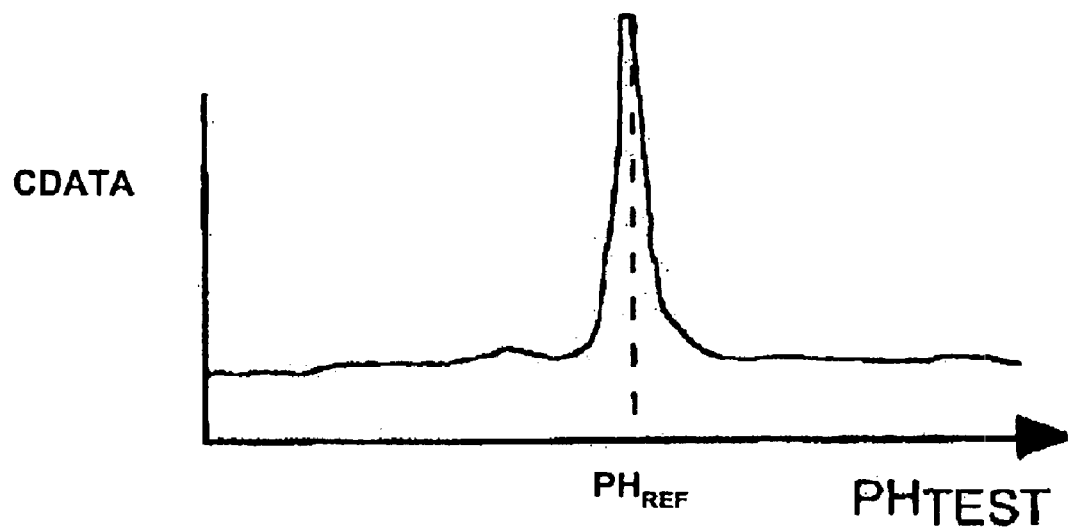
FIG. 14 is a plot of a data value produced by the apparatus of FIG. 10 relative to an amount of phase correlation between test and reference signals of FIG. 10.

FIG. 14 graphically illustrates the relationship between the value of CDATA that host computer 1030 reads and the phase of the TEST signal $PH_{TEST}$ relative to the phase $PH_{REF}$ of the REF signal. Note that CDATA increases rapidly to a maximum as $PH_{TEST}$ approaches $PH_{REF}$.

Figure 15:
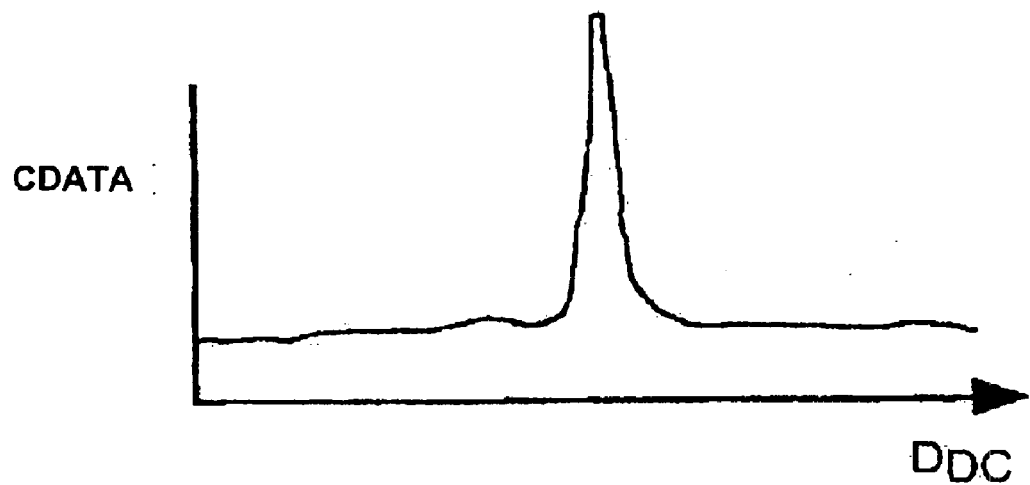
FIG. 15 is a plot of a data value produced by the apparatus of FIG. 10 relative to an value of delay calibration data provided to a tester channel of FIG. 10.

FIG. 15 graphically illustrates the relationship between the value of CDATA and the value of $D_{DC}$ the programmable drive calibration data host computer 1030 writes into the control and timing circuit 1046 of tester channel 901. Host computer 1030 iteratively adjusts the drive calibration data, resets the calibration unit 1052, and acquires the CDATA output of calibration unit 1052 several times in succession to determine a particular drive calibration delay $D_{DC}$ for which CDATA is reaches a maximum. Host computer 1030 then sets the drive calibration delay 903 to that level.

Host computer 1030 then signals prober 152 to position contact 1056 of calibration insert 1004 under the probe 164 conveying a TEST signal from a second one of the tester channels 901 and repeats the entire iterative calibration process to determine the particular delay that brings the second tester channel's TEST signal input in phase with the REF signal. That ensures that during a test, when the first and second channel's programming data tells the corresponding channel to produce a TEST signal edge at the same time relative to some CLOCK signal edge, the two TEST signal edges will arrive at the tips of their respective probes 164 at the same time. By repeating the drive delay calibration process for all tester channels, host computer 1030 can ensure that all channels 901 will be closely synchronized with one another with respect to the timing of their TEST signal edges.

The above-described calibration method can closely coordinate the channels' TEST signal edge timing even though noise and jitter in the TEST and REF signals during the calibration process causes random variations in the relative phases of individual TEST and REF signal edges. Since the CDATA output of calibration unit 1052 represents an average phase relationship between the TEST and REF signals over many TEST signal cycles, minor various in phase due to noise and jitter tend to be self-canceling.

As mentioned above the TEST and REF signal pulses produced during the calibration process need not be of pseudo-random spacing and width—they could be simple periodic waveforms having uniform pulse spacing and widths. However the TEST signals that can be generated during a test can have a wide range frequencies, and the inherent delay of signal paths conveying the TEST signals to the IC under test can be frequency dependent. IT is therefore preferable to use pseudorandom spacing because the frequency spectrum of a pseudo random pulse sequence is much flatter than that of a simple periodic waveform. Since a pseudo random sequence is more of a wideband signal than a simple periodic square wave, the drive calibration result is less frequency dependent.

After host computer 1030 has adjusted the drive calibration data for all channels 901 so that can closely coordinate their TEST signal timing, the host computer's next step is to appropriately adjust the compare calibration data of all channels 901. When the program data tells control and timing circuit 1046 to change the state of the TEST signal with a particular delay following the start of a test cycle, the TEST signal state change is supposed to occur at that time. Hence control and timing circuit 1046 must actually signal driver 1040 to change the state of the TEST signal sometime earlier to allow time for the TEST signal wave front to reach a test pad on wafer 160 (not shown) at the correct time during the test cycle. When host computer 1030 has adjusted the drive calibration data for all channels 901 as described above, then all of the channels 901 will deliver TEST signal edges to their respective test pads at the same time when they are programmed to do so.

Host computer 1030 must now appropriately adjust the compare calibration data for each channel 901 that the channel uses the same relative timing for FAIL signal sampling as it uses for TEST signal state changes. Test timing is referenced to TEST and RESPONSE signal events occurring at test pad. Thus when the test program data indicates that a channel 901 is to determine whether the RESPONSE signal matches the EXPECT data T ns after the start of a test cycle, the channel's acquisition system 44 must actually sample the FAIL signal some time later to allow for the time the RESPONSE signal requires to travel from test pad to comparator 42. This also allows for the time comparators 42 and 43 and acquisition system 44 require to produce and sample the FAIL signal.

Figure 16:
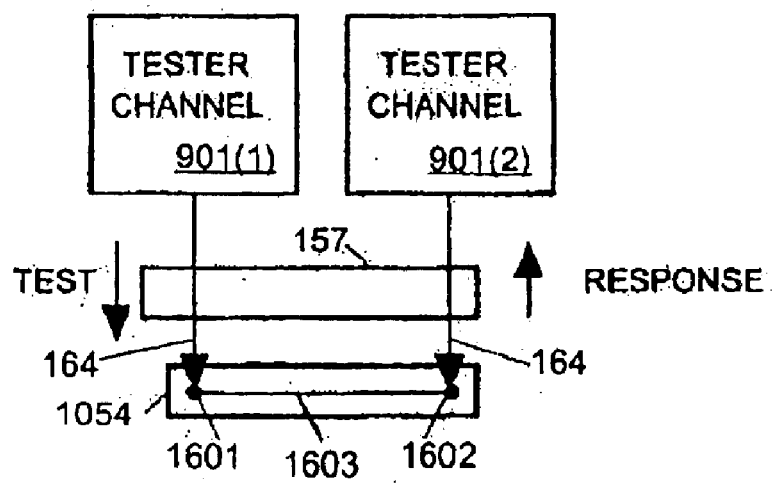
FIG. 16 is a block diagram illustrating a portion of an apparatus for calibrating timing of a channel of the tester of FIG. 10.

With all channel's test signal timing appropriately calibrated, host computer 1030 adjusts the compare calibration data of each channel. As illustrated in FIG. 16, calibration insert 1054 includes an additional pair of pads 1601 and 1602 linked by a conductor 1603. Conductor 1603 link two channels, such as channels 901(1) and 901(2), when calibration insert 1004 is positioned so that its probes 164 contact pads 1601 and 1602. Thus the TEST signal output of channel 901(1) becomes the RESPONSE signal input to channel 901(2). Host computer 1030 programs tester channel 901(1) produces an edge in the TEST signal T ns after the start of a test cycle, and programs channel 901(2) to sample its incoming RESPONSE signal T ns after the start of the same test cycle. Then, if the compare calibration delay 903(2) (see FIG. 10) of tester channel 901(2) is properly adjusted, the sample FAIL signal represents the state of a point on the RESPONSE signal that is as close as possible to the RESPONSE signal edge as allowed by the channel's timing resolution capability.

Figure 17:
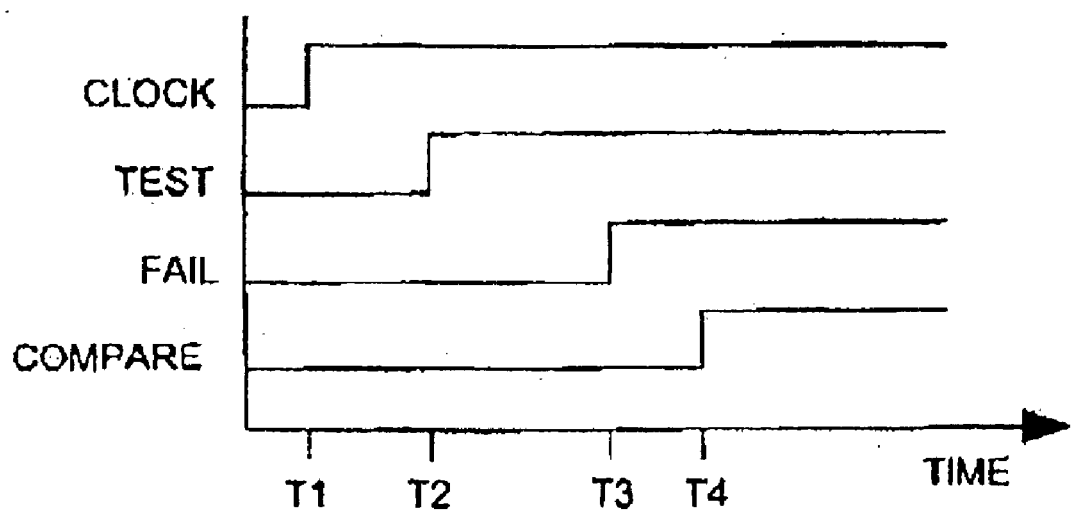
FIGS. 17–19 are additional timing diagrams illustrating timing relationships between various signals of FIG. 10 during an iterative calibration process.
Figure 18:
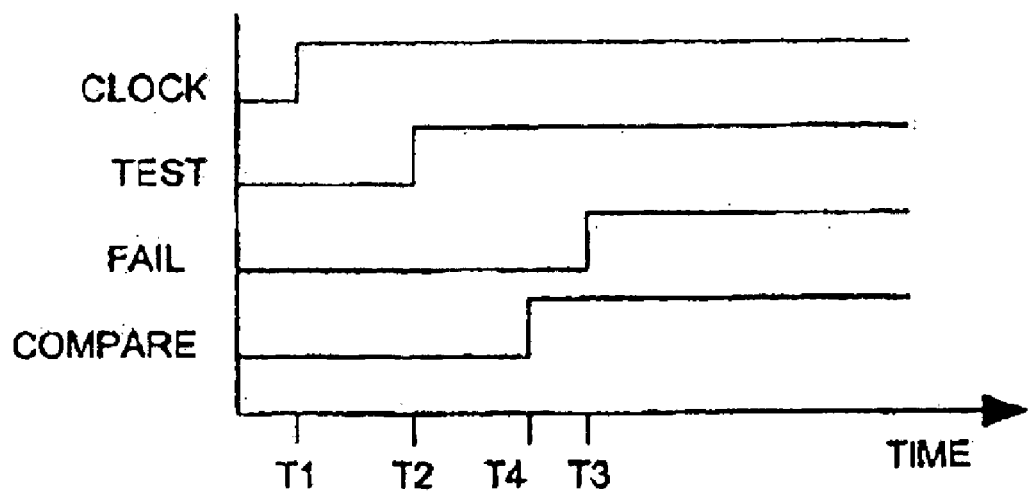
Figure 19:
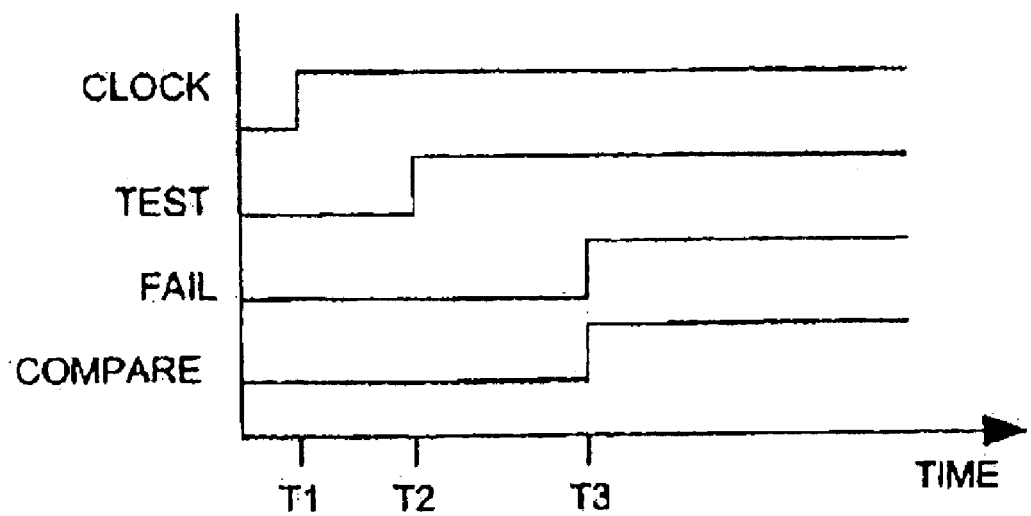

FIGS. 17–19 illustrate timing relationships between the CLOCK, TEST, FAIL and COMPARE signals during the compare calibration process. When host computer 1030 programs tester channel 901(1) so that it responds to each CLOCK signal edge arriving at a time T1 by sending a TEST signal edge to pad 70 at a time T2 where T2−T1=T ns, the FAIL signal changes state at some time T3 (FIG. 17) following the CLOCK signal edge. The delays T2−T1 and T3−T1 are fixed and do not change during the compare calibration process. When host computer 1030 also programs channel 901(2) so that it has a programmable COMPARE signal delay $D_{CD}$ of N, the total delay T4−T1 for the COMPARE signal will be the sum of $D_{CD}$, and the inherent and calibration delays of control and timing circuit 1046. Whenever the sampled FAIL data produced by receiving channel 901(2) indicates that the COMPARE signal edge follows the FAIL edge, as illustrated in FIG. 17, host computer 1030 decrements the compare calibration delay $D_{CC}$ of channel 901(2) to advance the COMPARE signal edge. Conversely, whenever the sampled FAIL data produced by receiving channel 901(2) indicates that the COMPARE signal edge precedes the FAIL edge, as illustrated in FIG. 18, host computer 1030 increments the compare calibration delay $D_{CC}$ of the receiving channel 901(2) to retard the COMPARE signal edge. The compare calibration process for the receiving channel 901 ends when the COMPARE signal edge as nearly as possible coincides with the FAIL signal edge at time T3 as illustrated in FIG. 19.

Calibration insert 1004 suitably includes other interconnected contacts similar to contact 1601 and 1602 arranged to allow each of the other tester channels 901(1) and 901(3)–901(N) to receive the TEST signal output of another channel so that host computer 1030 can use a similar procedure to appropriately adjust their compare calibration data.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method of testing a probe card comprising the steps of:
   positioning the probe card in a prober over a verification wafer;
   bringing the probe card in contact with a contact region on the verification wafer, the verification wafer including a shorting plane surrounding the contact region;
   sending a test signal through the contact region to the probe card; and
   receiving a response signal from the probe card through the verification wafer.

2. The method of claim 1, further including the step of receiving the response signal over a cable attached to the verification wafer.

3. The method of claim 1, further including the step of continuously sending test signals through the verification wafer while bringing the verification wafer in contact with the probe card so as to measure height of probes on the probe card.

4. The method of claim 1, further including the step of performing a continuity test on a signal path in the probe card.

5. The method of claim 4, further including the step of using time domain reflectometry (TDR) to perform the continuity test.

6. The method of claim 4, further including the step of using frequency domain reflectometry (FDR) to perform the continuity test.

7. The method of claim 1, further including the step of determining impedance of a signal path in the probe card.

8. The method of claim 1, further including the step of testing leakage current in the probe card.

9. The method of claim 1, further including the step of measuring planarity of the probe card by bringing the probe card and the verification wafer together until probes of the probe card make contact with the verification wafer, and measuring a position of the verification wafer along a direction perpendicular to the verification wafer.

10. The method of claim 1, further including the step of verifying location of probes of the probe card.

11. The method of claim 1, further including the steps of:
   bringing the probe card in contact with a plurality of contact regions on the verification wafer during the step of bringing the probe card in contact with the contact region;
   sending test signals through the contact regions on the verification wafer to the probe card; and
   receiving response signals from the probe card.

12. A method of testing a probe card comprising the steps of:
   positioning the probe card having probes in a prober over a blank wafer;

bringing the probe card in contact with the blank wafer;

making scrub marks on the blank wafer with the probes by moving the blank wafer in an X, Y plane; and examining the scrub marks on the blank wafer to determine location of the probes.

13. A method of testing a probe card comprising the steps of:

placing a verification wafer in a prober, the verification wafer having a contact region, a shorting plane surrounding the contact region, and an electrical connection to a tester;

positioning the probe card in the prober over the verification wafer;

bringing the probe card in contact with the contact region;

generating a test signal in the tester;

transmitting the test signal to the probe card through the contact region; and receiving a response signal from the probe card over the electrical connection.

14. The method of claim 13, wherein the electrical connection includes a cable attached to the verification wafer.

15. The method of claim 13, further including the step of continuously sending test signals through the verification wafer while bringing the verification wafer in contact with the probe card so as to measure height of probes on the probe card.

16. The method of claim 13, further including the step of performing a continuity test on a signal path between a test signal generator and the probe card.

17. The method of claim 16, further including the step of using time domain reflectometry (TDR) to perform the continuity test.

18. The method of claim 16, further including the step of using frequency domain reflectometry (FDR) to perform the continuity test.

19. The method of claim 13, further including the step of determining impedance of a signal path between a test signal generator and the probe card.

20. The method of claim 13, further including the step of testing leakage current in the probe card.

21. The method of claim 13, further including the step of measuring planarity of the probe card by bringing the probe card and the verification wafer together until probes of the probe card make contact with the verification wafer, and measuring a position of the verification wafer along a direction perpendicular to the verification wafer.

22. The method of claim 13, further including the step of verifying location of probes of the probe card.

23. The method of claim 13, further including the steps of:

bringing the probe card in contact with a plurality of contact regions on the verification wafer during the step of bringing the probe card in contact with the contact region;

sending test signals through the contact regions to the probe card; and receiving response signals from the probe card.

24. A system for testing a probe card comprising:

a prober including means for moving a verification wafer in at least a vertical direction;

a verification wafer positioned on means for moving and having a contact region surrounded by a shorting plane;

an electrical connection from the contact region to a test signal generator, wherein signals generated by the test signal generator are transmitted to a probe on a probe card under test.

25. The system of claim 24, wherein the verification wafer includes a plurality of contact regions surrounded by the shorting plane for testing multiple probes on the probe card under test.

26. The system of claim 24, wherein the electrical connection is one of a coaxial cable and a flex cable.

27. The system of claim 24, wherein the test generator includes a time domain reflectometry apparatus.

28. The system of claim 24, wherein the test generator includes a frequency domain reflectometry apparatus.

* * * * *